US006297516B1

(12) United States Patent
Forrest et al.

(10) Patent No.: US 6,297,516 B1
(45) Date of Patent: Oct. 2, 2001

(54) METHOD FOR DEPOSITION AND PATTERNING OF ORGANIC THIN FILM

(75) Inventors: Stephen R. Forrest, Princeton;
Vladimir Bulovic, Metuchen; Paul Burrows, Princeton Junction, all of NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/344,722

(22) Filed: Jun. 25, 1999

Related U.S. Application Data

(62) Division of application No. 08/976,666, filed on Nov. 24, 1997, now Pat. No. 5,953,587.

(51) Int. Cl.[7] ............................. H01L 51/10; H01L 33/00
(52) U.S. Cl. .................... 257/40; 257/91; 257/99; 257/103; 313/504
(58) Field of Search ........................... 257/40, 81, 99, 257/89, 91, 103; 313/500, 502, 503, 504, 505, 506; 428/917

(56) References Cited

U.S. PATENT DOCUMENTS

| | | | | |
|---|---|---|---|---|
| 3,153,166 | * | 10/1964 | Thornton, Jr. et al. | 313/506 |
| 3,303,357 | * | 2/1967 | White | 257/40 |
| 3,813,587 | * | 5/1974 | Umeda et al. | 257/99 |
| 4,005,457 | * | 1/1977 | Hill et al. | 257/99 |
| 4,728,519 | * | 3/1988 | Tanimoto | 427/66 |
| 4,883,770 | * | 11/1989 | Dohler et al. | 437/110 |
| 5,294,870 | | 3/1994 | Tang | 313/504 |
| 5,585,695 | * | 12/1996 | Kitai | 313/506 |
| 5,641,611 | * | 6/1997 | Shieh et al. | 438/35 |
| 5,652,067 | * | 7/1997 | Ito et al. | 428/690 |
| 5,663,573 | * | 9/1997 | Epstein et al. | 257/40 |
| 5,821,690 | * | 10/1998 | Martens et al. | 313/506 |
| 5,917,280 | * | 6/1999 | Burrows et al. | 313/506 |
| 5,932,895 | * | 8/1999 | Shen et al. | 257/89 |
| 6,010,742 | * | 1/2000 | Tanabe et al. | 427/66 |
| 6,028,327 | * | 2/2000 | Mizoguchi et al. | 257/98 |

FOREIGN PATENT DOCUMENTS

| | | | | |
|---|---|---|---|---|
| 502590-A2 | * | 9/1992 | (EP) | 257/40 |
| WO 96/19792 | | 6/1996 | (WO) . | |

OTHER PUBLICATIONS

Noach et al., "Microfabrication of an electroluminescent polymer light emitting diode pixel array", Appl. Phys. Lett. 69 (24), Dec. 9, 1996, pp. 3650–3652.
M. Hatzakis, "Multilayer Resist Systems for Lithography", Solid State Technology, Aug. 1981, pp. 74–80.
Witman et al., "A Simple Bilayer Lift–Off Process", Microelectronic Engineering, 11 (1990) pp. 549–552.
V. Bouchait and D. Esteve, "Lift–off lithography using an atomic force microscope", Appl. Phys. Lett. 69(20, Nov. 11, 1996, pp. 3098–3100.
C. Hosokawa, "L2.3: Organic Multicolor EL Display with Fine Pixels", SID 97 Digest, pp. 1073–1076.
J.M. Moran and D.J. Maydan, "High resolution, steep profile resist patterns", J. Vac. Sci. Technol., 16(6), Nov./Dec. 1979, pp. 1620–1624.
W.R. Runyan & K.E. Bean, Semiconductor Integreted Circuit Processing Technology, p. 560, Addison–Wesley, 1990.
E. Ong and E.L. Hu, "Multilayer Resists for Fine Line Optical Lithography," Solid State Technology, Jun. 1984.
T. Wakimoto, et al., "Stability Characteristics of Quinacridone and Coumarin Moleculars as Guest Dopants in the Organic LEDs", 21–1–03 (Abstract).

* cited by examiner

*Primary Examiner*—Eddie Lee
*Assistant Examiner*—Bradley W. Baumeister
(74) *Attorney, Agent, or Firm*—Kenyon & Kenyon

(57) ABSTRACT

A patterning system with a photoresist overhang allows material to be deposited onto a substrate in various positions by varying the angle from which the material is deposited, and by rotating the substrate. The patterning system can be used to fabricate a stack of organic light emitting devices on a substrate using the same patterning system and without removing the substrate from vacuum.

7 Claims, 14 Drawing Sheets

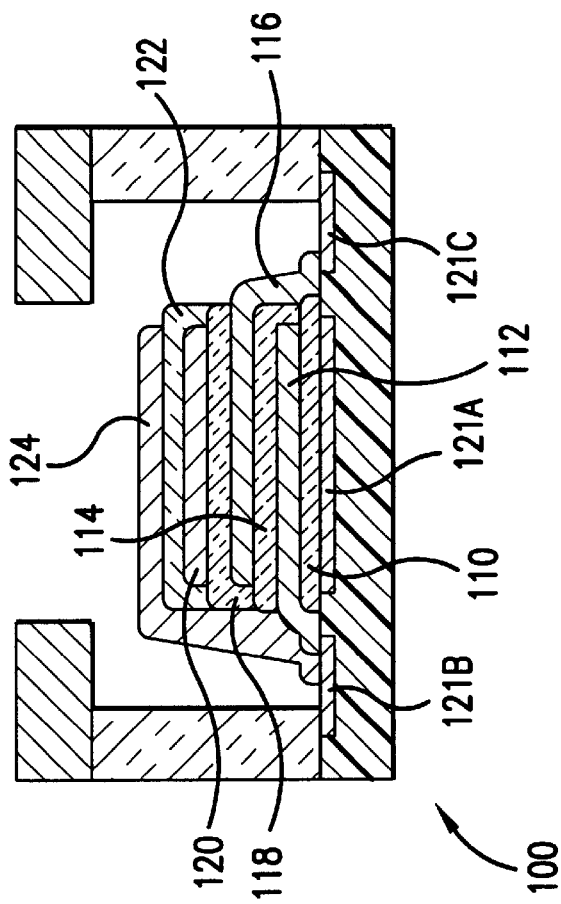
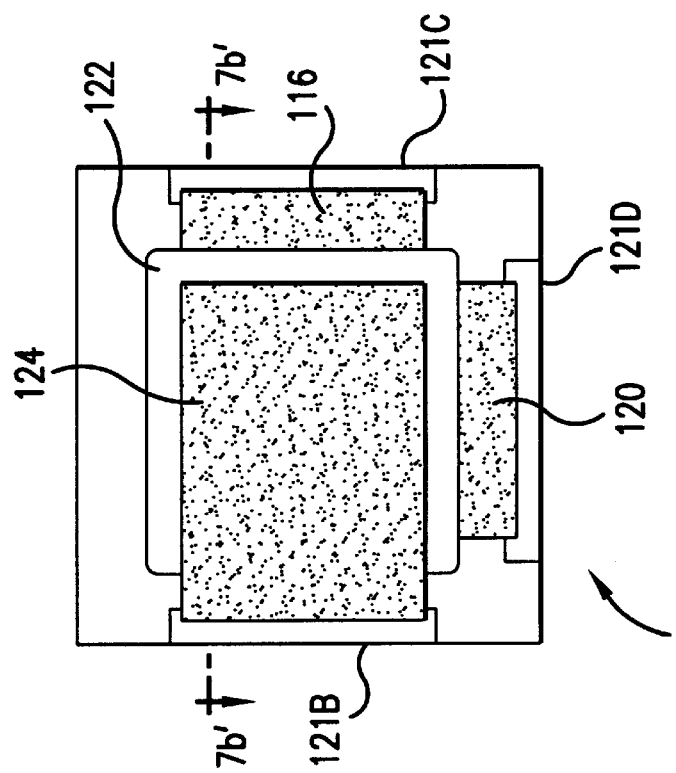

METHOD FOR DEPOSITION AND PATTERNING OF ORGANIC THIN FILM

RELATED APPLICATIONS

The present application is a divisional of application Ser. No. 08/976,666, filed Nov. 24, 1997, now U.S. Pat. No. 5,953,587, which is incorporated by reference in its entirety, and claims priority therefrom.

GOVERNMENT RIGHTS

This invention was made with Government support under Contract No. F33615-94-1-1414, awarded by the Defense Advanced Research Projects Agency. The Government has certain rights in this invention.

FIELD OF THE INVENTION

The present invention relates to deposition and patterning, methods for thin films, and more particularly to photolithographic patterning methods which are suitable for producing organic light emitting devices (OLEDs) suitable for commercial flat panel displays, and to vacuum deposited devices fabricated using such photolithographic patterning, methods. More specifically, the present invention provides a single patterning system that can be used to pattern the various layers that comprise a three color stacked OLED (SOLED) without removing the SOLED from vacuum.

BACKGROUND OF THE INVENTION

Organic light emitting devices, which make use of thin film materials that emit light when excited by electric current, are becoming an increasingly popular technology for applications such as flat panel displays. Popular OLED configurations include double heterostructure, single heterostructure, and single layer, as described in PCT Application WO 96/19792, which is incorporated by reference.

OLED's may be fabricated using shadow mask technology. However, it is difficult to accurately align multiple layers of deposited material using shadow masks, and the masks tend to clog. Moreover, it is difficult to fabricate features smaller than about 300 microns using a shadow mask, whereas OLEDs smaller than about 100 microns by 100 microns, and possibly smaller than about 10 microns by 10 microns, are preferred for a high resolution, full color flat panel display.

An array of 20 micron×20 micron polymer LEDs has been fabricated using direct photoablation with the 193 nm. emission of an eximer laser. S. Noach et al, Appl. Phys. Lett. 69, 3650, Dec. 9, 1996. While this dimension is suitable for a high resolution display, the low speed of laser photoablation are undesirable for commercialization.

Photolithographic patterning involves the use of a photoresist to create patterns in a material deposited on a substrate, and can be used to pattern materials and fabricate devices on a submicron scale, much smaller than can be achieved with shadow mask technology. Photolithographic patterning is also well suited to commercialization because it can be used to quickly fabricate large panels. However, the organic materials used to fabricate OLEDs may be quickly degraded from exposure to deleterious substances such as water, solvents, developers, and even atmospheric conditions. In particular, many of the chemicals used in photolithographic processing, such as solvents and developers used to wash away photoresist, may rapidly degrade such organic materials. Great care should be taken to ensure that the organic materials are not exposed to deleterious substances during the patterning of top electrodes and afterward.

U.S. Pat. No. 5,294,870 to Tang discloses the use of a series of parallel walls formed by photolithography prior to deposition of an organic EL layer such that photolithographic patterning steps or wet chemistry are not required after the organic EL medium is deposited.

It is known to use a multi-layer photoresist system with an overhang to deposit materials with sloped edges. W. R. Runyan & K. E. Bean, Semiconductor Integrated Circuit Processing Technology, p.560, Addison-Wesley, 1990. It is also known to use a photoresist system with an overhang to deposit small features, and to facilitate the lift-off of photoresist after material has been deposited in applications such as the fabrication of narrow gate gallium arsenide transistors.

SUMMARY OF THE INVENTION

A new processing method for patterning small features in organic thin films using photolithographic patterning is described. In this method all photolithographic processing steps are performed prior to organic film deposition. The organic films and electrodes that comprise a SOLED, or similar multi-electrode organic-based device, are then deposited in sequence without being removed from vacuum. This method avoids exposure of the organic layers to conventional photolithographic solvents, such as trichloroethylene, acetone, methanol, ethanol, and propanol, that can modify mechanical and electrical properties of organic thin films.

In accordance with an embodiment of the present invention, a method of fabricating an organic thin film device is provided that includes the steps of: creating a patterning system having an insulation layer and a photoresist layer with a photoresist overhang on a substrate having a plurality of contact pads; depositing through the patterning system a first electrode that electrically connects to a first contact pad of said plurality of contact pads; depositing through the patterning system a organic layer that electrically connects to the first electrode; and depositing through the patterning system a second electrode that electrically connects to the first organic layer and a second contact pad of said plurality of contact pads.

In accordance with an embodiment of the present invention, a method of fabricating a stacked organic thin film device is provided that includes the steps of: creating a patterning system having an insulation layer and a photoresist layer with a photoresist overhang on a substrate having a first contact pad, a second contact pad, a third contact pad, and a fourth contact pad; depositing through the patterning system a first organic layer that covers and electrically connects to the first contact pad; depositing through the patterning system a first electrode that electrically connects to the second contact pad and the first organic layer; depositing through the patterning system a second organic layer that electrically connects to the first electrode; depositing through the patterning system a second electrode that electrically connects to the third contact pad and the second organic layer; and depositing through the patterning system a third organic layer that electrically connects to the second electrode; depositing through the patterning system a third electrode that electrically connects to the fourth contact pad and the third organic layer.

In accordance with an embodiment of the present invention, a method of fabricating a stacked organic thin film device is provided that includes the steps of: creating a patterning system having an insulation layer and a photoresist layer with a photoresist overhang on a substrate having a first contact pad, a second contact pad, a third contact pad, and a fourth contact pad; depositing through the patterning system a first organic layer that covers and electrically connects to the first contact pad; depositing through the patterning system a first electrode that electrically connects to the second contact pad and the first organic layer; depositing through the patterning system a second organic layer that electrically connects to the first electrode; depositing through the patterning system a second electrode that electrically connects to the third contact pad and the second organic layer; depositing through the patterning system an insulating layer on top of the second electrode; depositing through the patterning system a third electrode on top of the insulating layer that electrically connects to the fourth contact pad, and is electrically insulated from the second electrode by the insulating layer; depositing through the patterning system a third organic layer that electrically connects to the third electrode; and depositing through the patterning system a fourth electrode that electrically connects to the second contact pad and the third organic layer.

BRIEF DESCRIPTION OF THE DRAWINGS

FIG. 1b shows a cross-section of the patterning system of FIG. 1a.

FIG. 5b shows a cross-section of the contact pads and transmission pads of FIG. 5a.

FIG. 7a shows a top view of an embodiment of the present invention having two electrodes connected a single contact pad.

FIG. 7b shows a cross section of the embodiment of FIG. 7a.

DETAILED DESCRIPTION

Figure 1A:
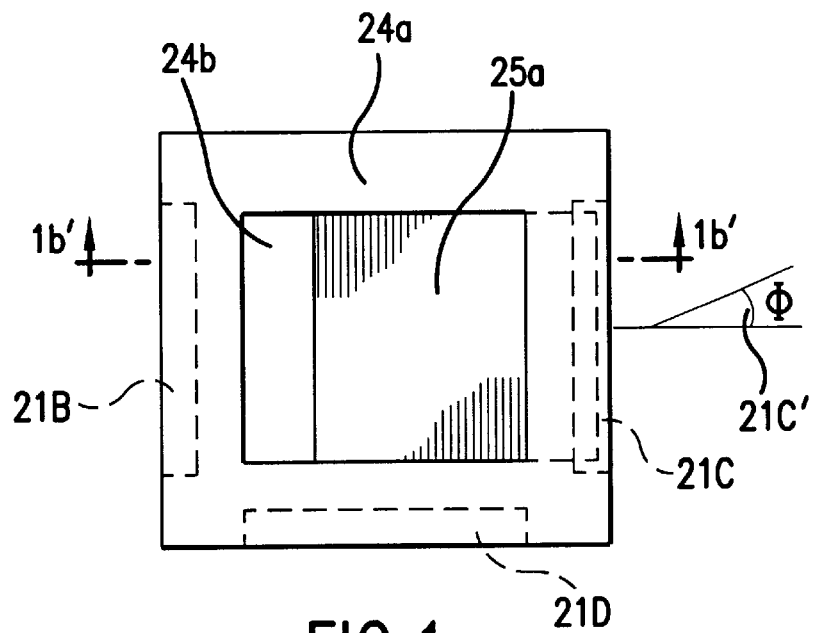
FIG. 1a shows a top view of a patterning system as used to deposit a layer from an angle onto a stationary substrate in accordance with an embodiment of the present invention.

The present invention will be described with reference to the illustrative embodiments in the following processes and drawing figures.

A patterning system 22, comprising an insulating layer 23 and a photoresist layer 24, which has an overhang 24a and an opening 24b, can be used to deposit material onto substrate 20 in different patterns by varying the angle and direction from which the material is deposited, as well as by rotating substrate 20 about an axis 20' substantially normal to substrate 20, as will now be described with reference to FIGS. 1a through 1d.

Figure 1B:
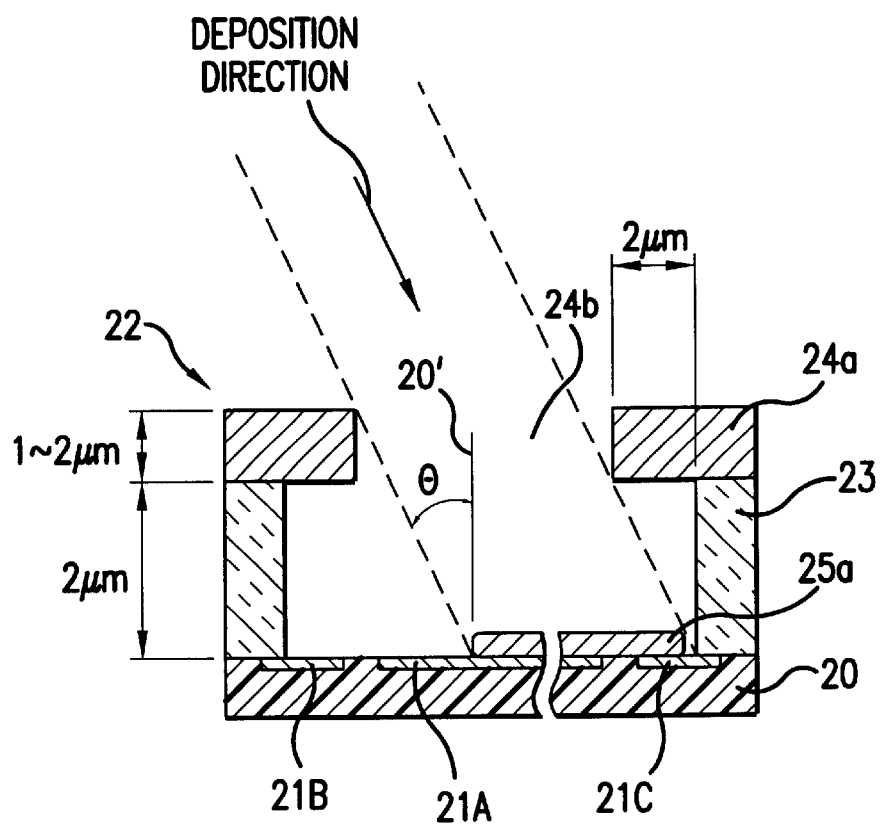

FIGS. 1a and 1b show the angular deposition of a layer 25a onto substrate 20, which is stationary having contact pads 21, including contact pads 21A, 21B, 21C and 21D. FIG. 1a is a top view, and FIG. 1b is a cross section taken through line 1b' of FIG. 1a. Layer 25a is deposited from an angle θ that is measured as an angle from an axis 20' normal to substrate 20, and a direction φ that is measured as an angle from an axis 21C'. Because substrate 20 is held stationary while layer 25a is deposited, the shape and size of layer 25a are defined by the shape and size of opening 24b in photoresist 24. Angle θ and direction φ determine the position of layer 25a on substrate 20. In FIGS. 1a and 1b, θ is about 30° and φ is about 180°, such that layer 25a is deposited over contact pad 21C, but not contact pads 21B and 21D.

Figure 1C:
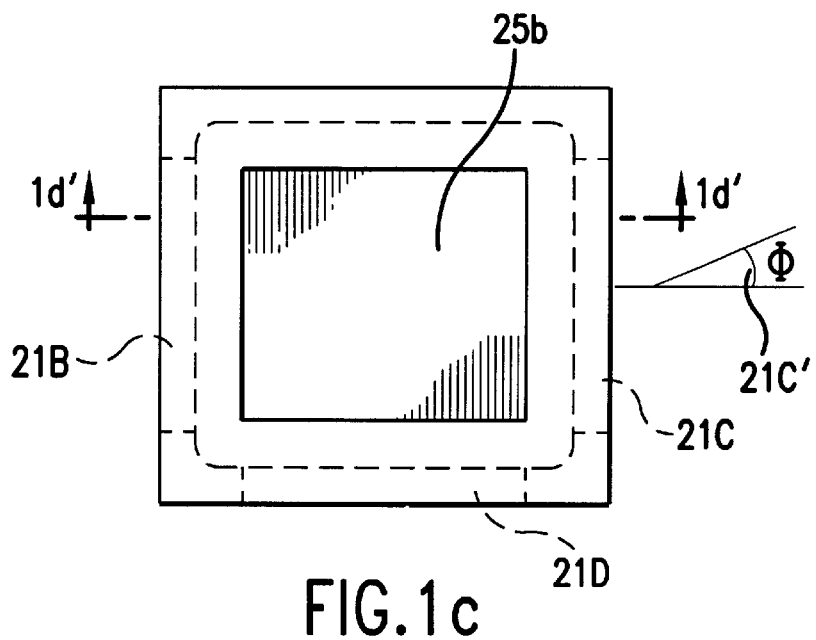
FIG. 1c shows a top view of the patterning system of FIG. 1a as used to deposit a layer from an angle onto a rotating substrate in accordance with an embodiment of the present invention.
Figure 1D:
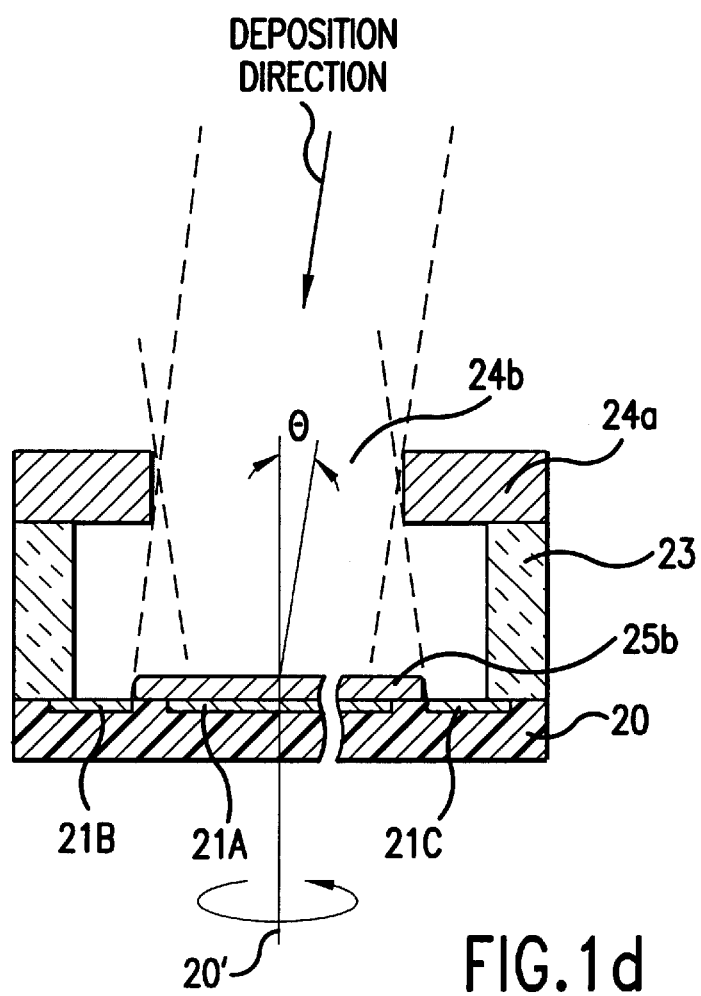
FIG. 1d shows a cross-section of the patterning system of FIG. 1c.

FIGS. 1c and 1d show a layer 25b angularly deposited onto substrate 20 as substrate 20 is rotating about axis 20'. FIG. 1c is a top view, and FIG. 1d is a cross section taken through line 1d' of FIG. 1c. The rotation of substrate 20 causes direction φ from which layer 25b is deposited to change relative to substrate 20 throughout deposition, and allows layer 25b to cover a larger area of substrate 20 than would be covered if substrate 20 were held stationary. Layer 25b is deposited from an angle θ, which determines the size of layer 25b.

Patterning System

A process for fabricating patterning system 22 in accordance with an embodiment of the present invention will now be described with reference to FIGS. 1a and 1b.

1) Deposit an insulating layer 23. Insulating layer 23 is preferably deposited to a thickness of about 1.5 to 3 microns, and more preferably to a thickness of about 2 microns. Insulating layer 23 can be made of any insulating material that can be wet etched to form an undercut and photoresist overhang 24a. For example, insulating layer 23 can be made of SiO, $SiO_2$, or $SiN_x$ deposited by e-beam or plasma enhanced chemical vapor deposition, or polyimide deposited by spinning.

2) Deposit photoresist layer 24 by spinning onto insulating layer 23 to a thickness of about 1 to 2 microns. Photoresist layer 24 can be made of AZ4210 or AZ4110, from Hoechst Celanese Corporation, for example.

3) Soft bake photoresist layer 24 at a temperature and time which depend on the layer material and the baking method. For example, if AZ4210 is used, the soft bake may be for 3 minutes at 105° C.

4) Selectively expose opening 24b, but not overhang 24a, to radiation and develop. While the present embodiment describes the use of a positive photoresist, i.e. a photoresist that can be removed by developer only where exposed to radiation, it is also possible to practice the present invention using negative photoresist, i.e. a photoresist that can be removed in developer only where not exposed to radiation, by exposing overhang 24a, but not opening 24b.

5) Wet etch insulating layer 23, creating overhang 24a. By controlling the etch temperature, etch time, etchant concentration, etchant stir speed, and the thickness to which insulating layer 23 is deposited, the size of overhang 24a can be controlled. For example, a mixture of 70 ml BOE (buffered oxide etchant) (10:1), which is 36.5% (w/w) ammonium fluoride, 4.5% (w/w) hydrofluoric acid, and 59% (w/w) deionized water, with 5 ml hydrofluoric acid (49% in deionized water)

can be used at 20° C. for 4.5 minutes at a stir speed of 400 rpm to etch a 2 micron thick $SiO_2$ insulating layer 23 deposited by plasma enhanced chemical vapor deposition to create a 10 micron overhang 24a. A smaller overhang 24a of 2 microns can be obtained by using BOE (10:1) at 15° C. for 8 minutes with no stir on a 1.7 micron thick $SiO_2$ insulating layer 23 deposited by electron beam evaporation. The etchant used to etch insulating layer 23 may not etch structures underlying insulating layer 23, such as substrate 20 and contact pads 21. For example, if BOE (10:1) is used to etch insulating layer 23, substrate 20 should not be a material which would be etched by BOE, e.g. $SiO_2$ or $SiN_x$.

Stacked Organic Light Emitting Devices

Figure 2A:
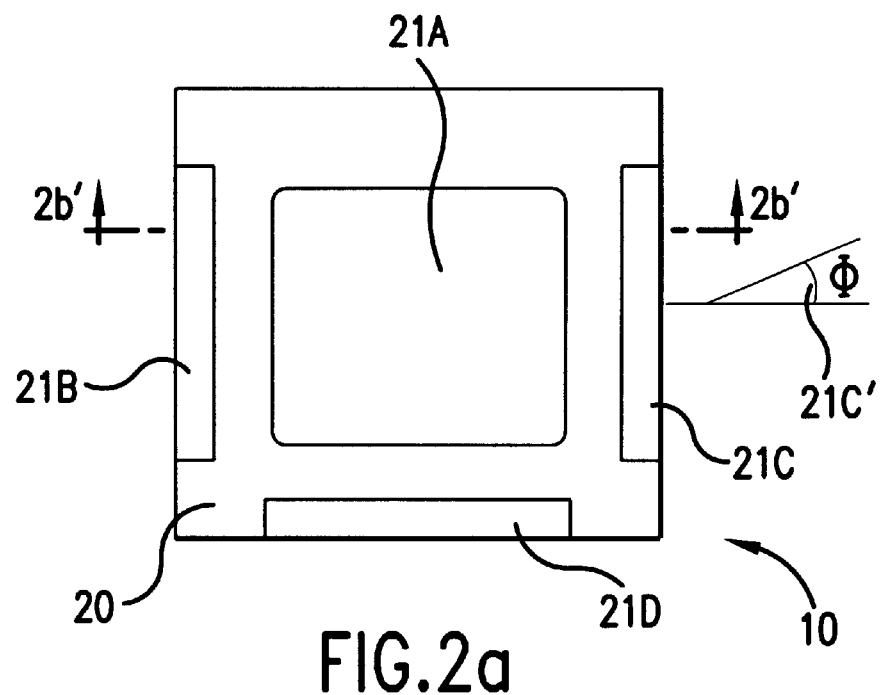
FIGS. 2a through 2p shows an embodiment of the present invention as it appears after various processing steps.
Figure 2B:
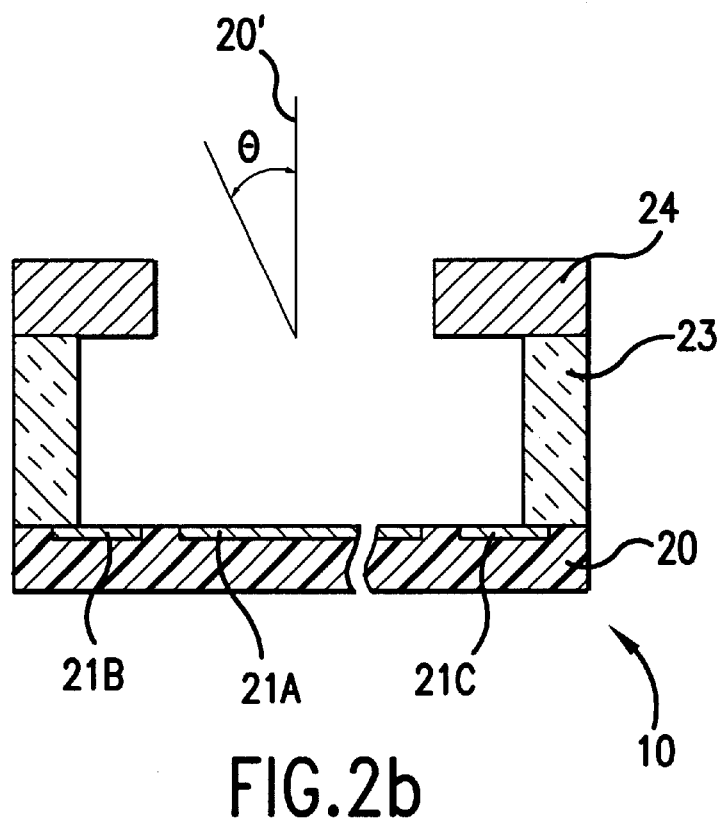
Figure 2C:
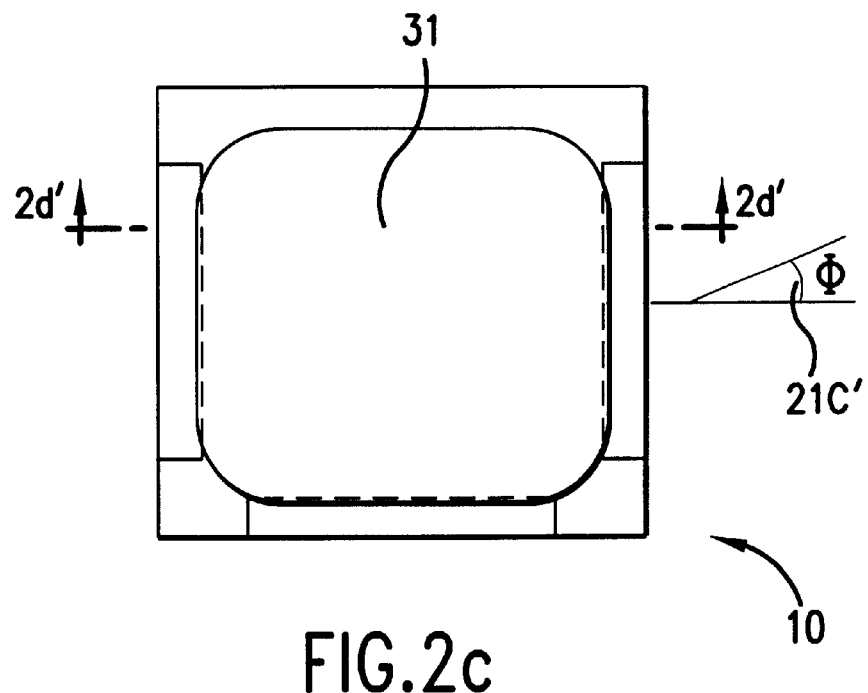
Figure 2D:
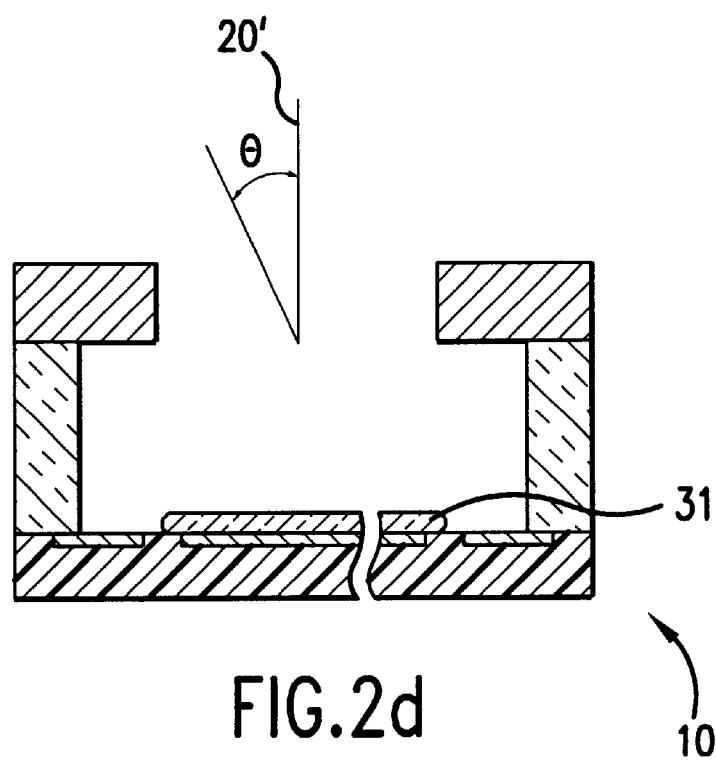
Figure 2E:
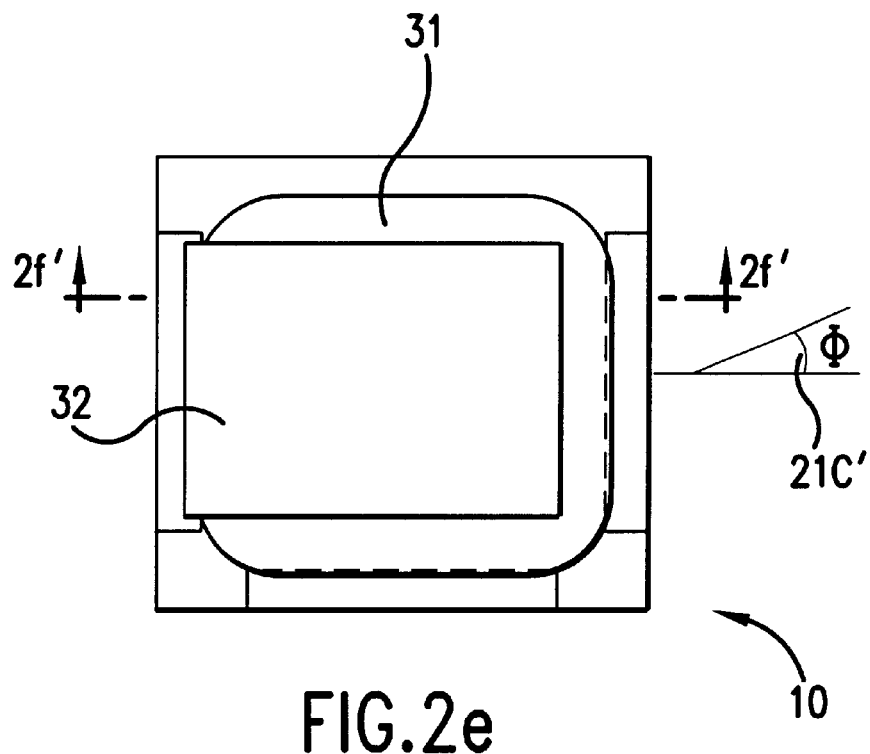
Figure 2F:
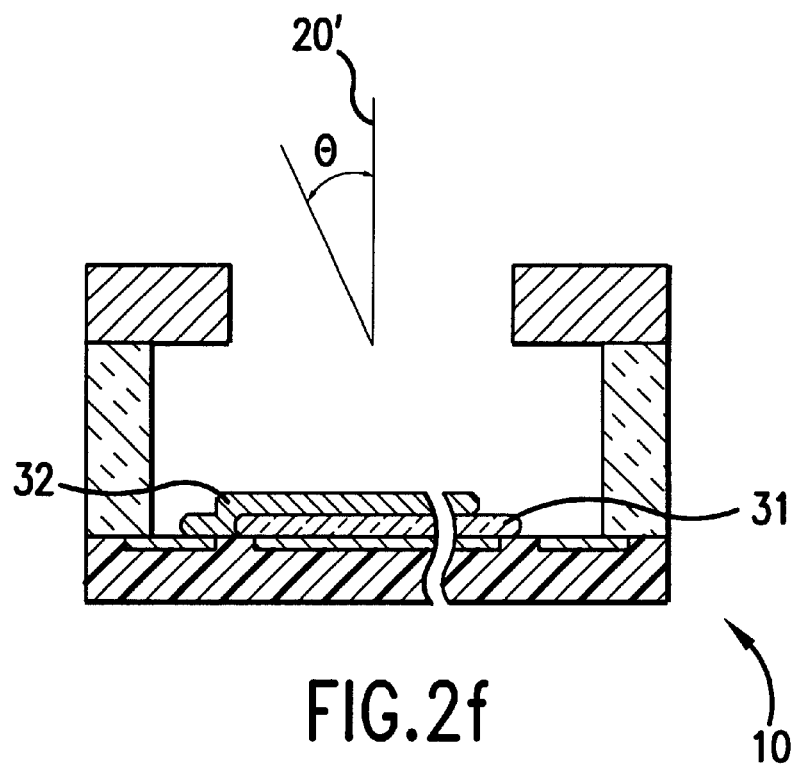
Figure 2G:
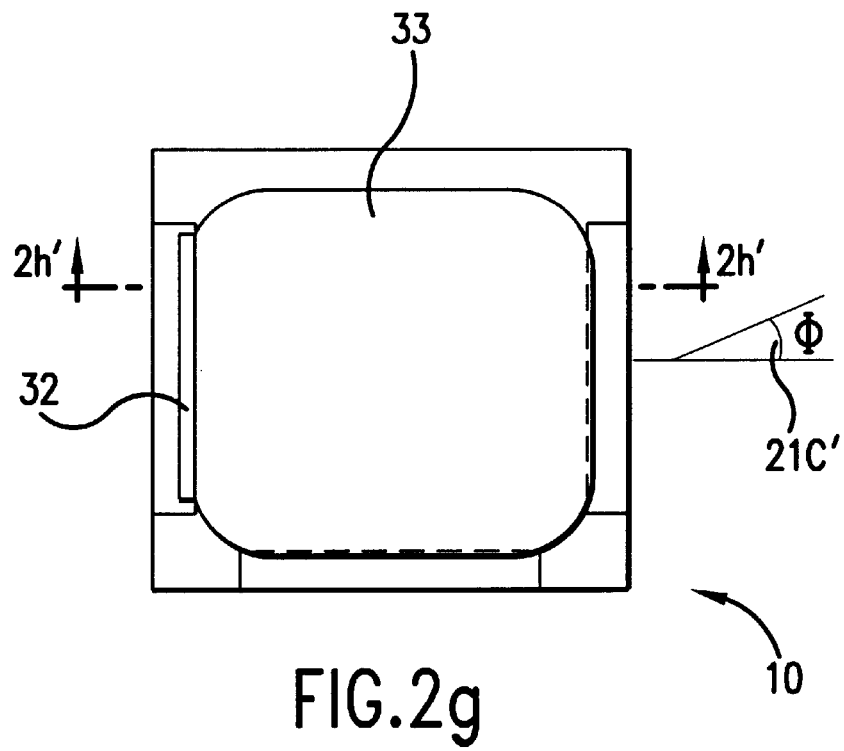
Figure 2H:
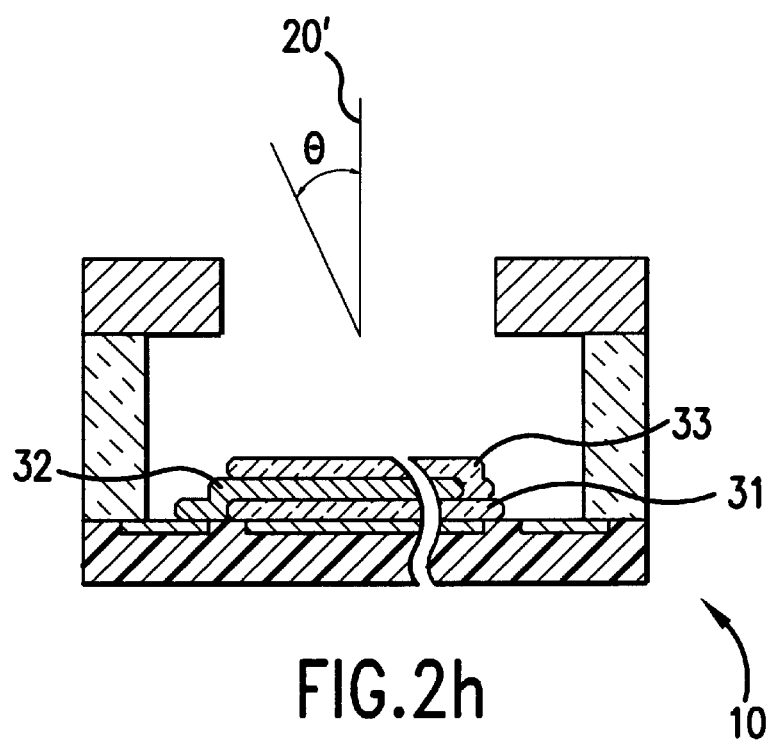
Figure 2I:
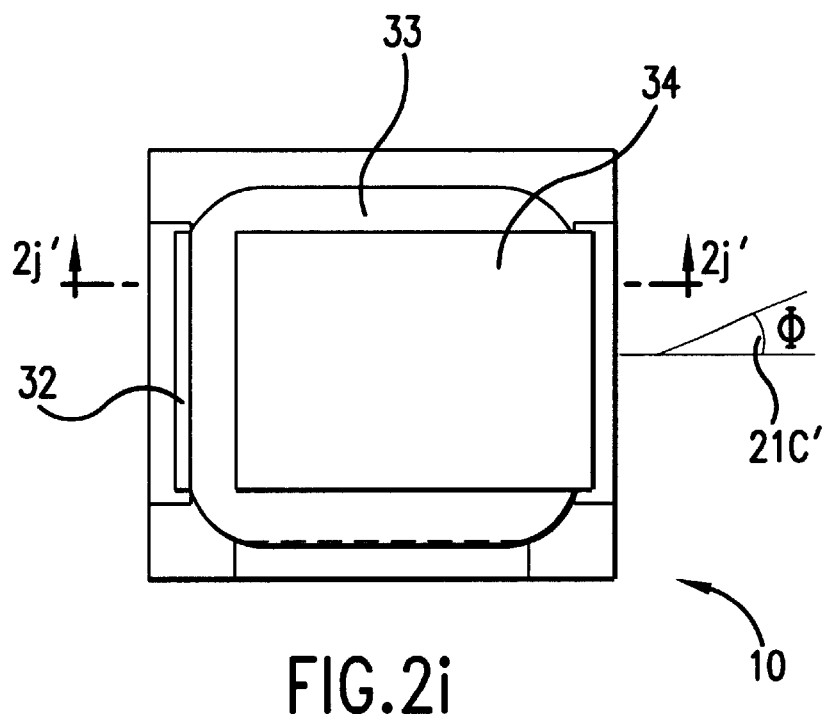
Figure 2J:
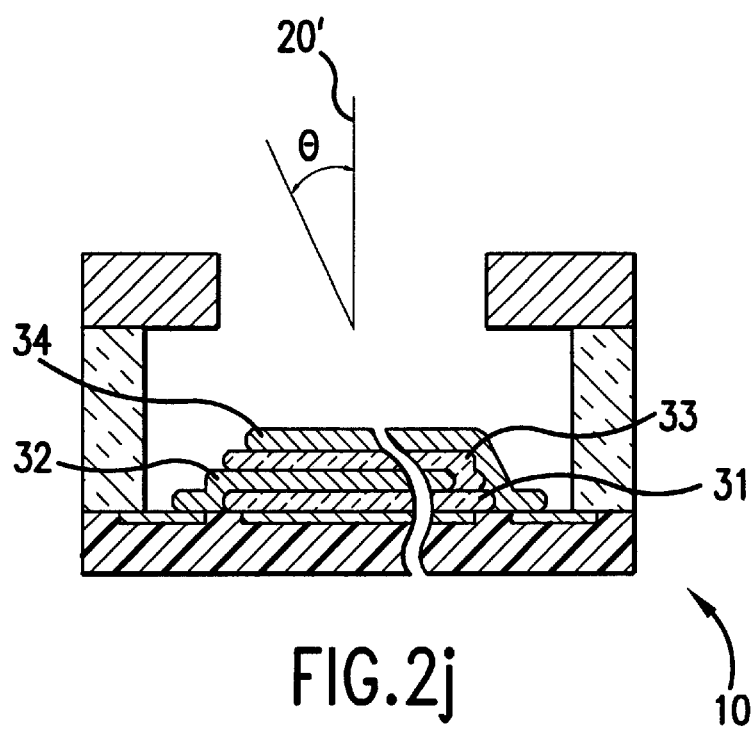
Figure 2K:
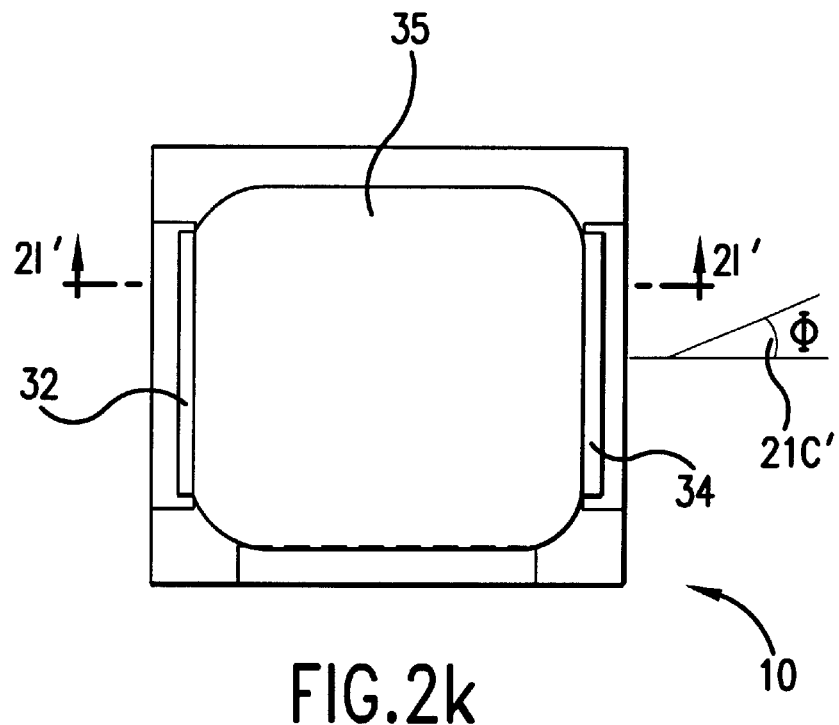
Figure 2L:
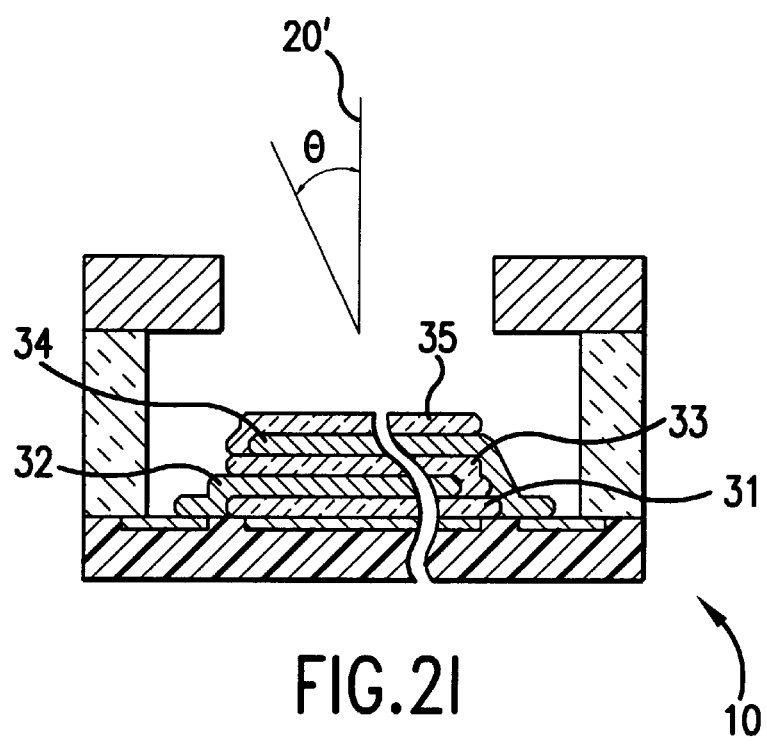
Figure 2M:
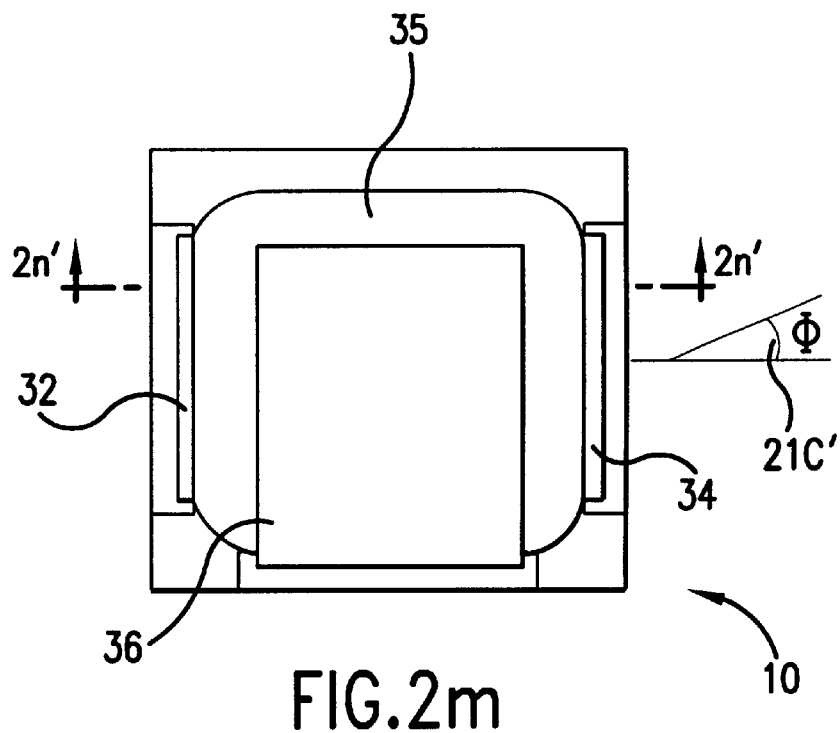
Figure 2N:
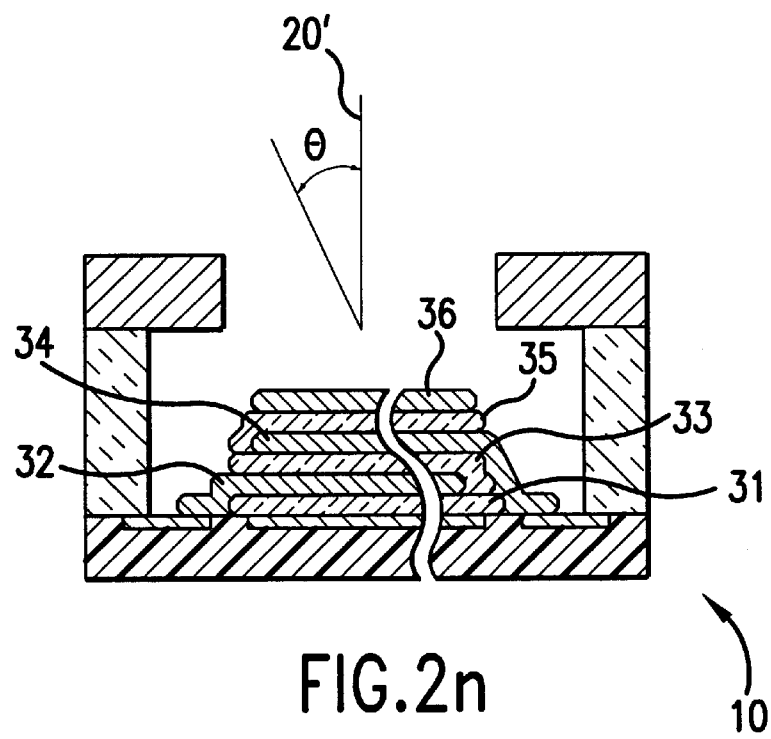
Figure 2O:
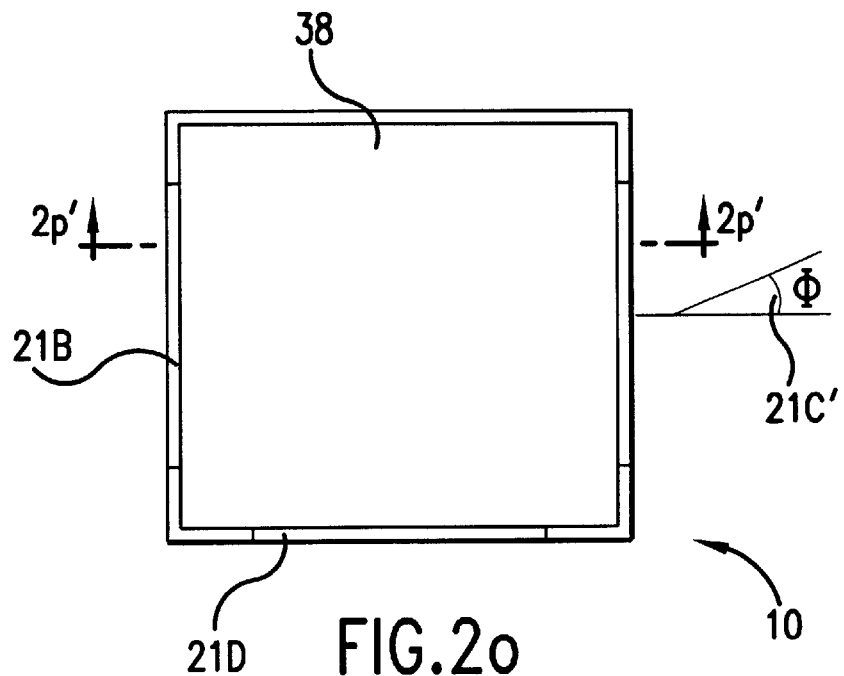
Figure 2P:
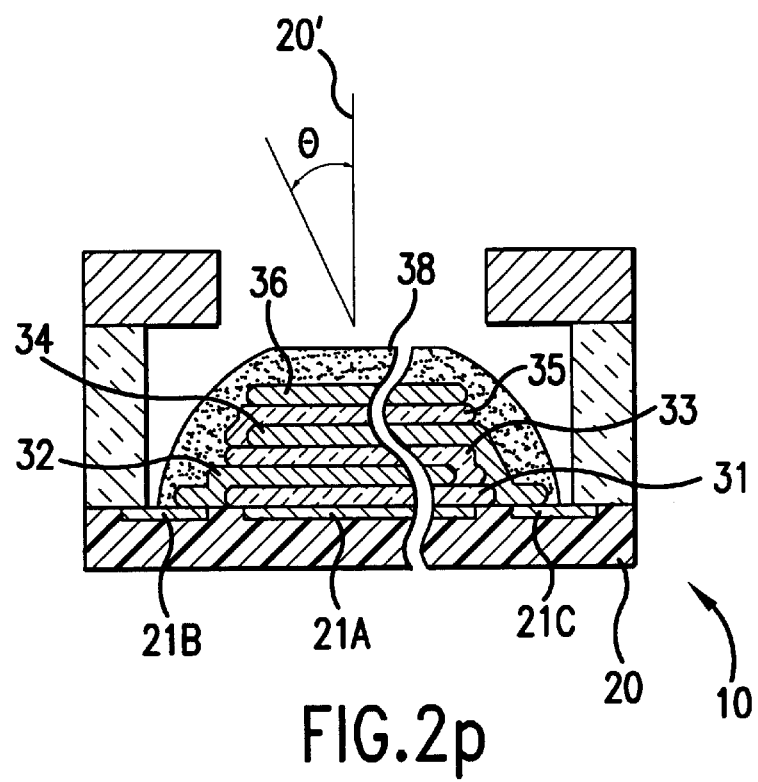

FIGS. 2o and 2p show a three color SOLED fabricated in accordance with an embodiment of the present invention. A contact pad 21A, a first organic layer(s) 31, a first electrode 32, a second organic layer(s) 33, a second electrode 34, a third organic layer(s) 35 and a third electrode 36 are stacked in that order. A protective cap 38 covers any exposed surface of organic layer(s) 31, 33 and 35, and electrodes 32, 34 and 36. First organic layer(s) 31 is disposed between and electrically connected to contact pad 21A and first electrode 32. Second organic layer(s) 33 is disposed between and electrically connected to first electrode 32 and second electrode 34. Third organic layer(s) 35 is disposed between and electrically connected to second electrode 34 and third electrode 36. Light emission from first organic layer(s) 31 occurs when a voltage is applied between contact pad 21A contact pad 21B, which is electrically connected to first electrode 32. Light emission from second organic layer(s) 33 occurs when a voltage is applied between contact pads 21B and 21C, which are electrically connected to first electrode 32 and second electrode 34, respectively. Light emission from third organic layer(s) 35 occurs when a voltage is applied between contact pads 21C and 21D, which are electrically connected to second electrode 34 and third electrode 36, respectively. The intensity of the light emitted is determined by the magnitude of the current resulting from the applied voltage. Appropriate selection of light emitting organic materials for first organic layer(s) 31, second organic layer(s) 33 and third organic layer(s) 35, allows device 10 to emit any of various combinations of red, green and blue light by controlling the voltages on contact pads 21A, 21B, 21C and 21D.

A process for fabricating the three color SOLED device 10 of FIGS. 2o and 2p, in accordance with an embodiment of the present invention, will now be described with reference to FIGS. 2a through 2p. While the fabrication of a single pixel is described, an entire array of pixels can be fabricated simultaneously. FIGS. 2b, 2d, 2f, 2h, 2j, 2l, 2n and 2p are cross sections taken through lines 2b', 2d', 2f', 2h', 2j', 2l', 2n' and 2p' of FIGS. 2a, 2c, 2e, 2g, 2i, 2k, 2m and 2o, respectively. Insulating layer 23 and photoresist layer 24 are not shown in FIGS. 2a. 2c, 2e, 2g, 2i, 2k, 2m and 2o so that device 10 can be more clearly illustrated.

FIGS. 2a and 2b show substrate 20 with contact pads 21 prior to the fabrication of device 10. Substrate 20 provides a foundation upon which device 10 may be fabricated, and transmits power to device 10. Contact pads 21 provide a convenient geometry for the transmission of power to device 10. In one embodiment, device 10 transmits light through substrate 20 to a viewer, in which case substrate 20 and contact pad 21A should be transparent, i.e. the material, at the thickness used, is capable of transmitting light of the wavelengths emitted by device 10, preferably transmitting substantially all of the light emitted. If device 10 is to transmit light through substrate 20, substrate 20 is preferably transparent glass, quartz, sapphire or plastic, and contact pad 21A is preferably a conductive metal such as gold, silver or aluminum, preferably deposited to a thickness of about 50–200 Å and more preferably to a thickness of about 100 Å, or a conductive oxide such as ITO preferably deposited to a thickness of about 1000–2000 Å, and more preferably to a thickness of about 1200–1500 Å. Contact pads 21B, 21C and 21D need not be transparent, but are preferably made of the same materials deposited to a thickness which allows for low resistance conduction. If device 10 is to transmit light away from substrate 20, substrate 20 may be made of an opaque material such as silicon, or a metal foil, and contact pads 21 may be made of any conductive material regardless of whether it transmits light.

1) A first organic layer(s) 31 is deposited onto substrate 20 from an angle $\theta_{organic}$ while substrate 20 is rotating about axis 20'. Angle $\theta_{organic}$ of step (1) is chosen such that first organic layer(s) 31 covers contact pad 21A, but does not cover contact pads 21B. 21C and 21D, and leaves sufficient clearance for subsequently deposited first electrode 32, second electrode 34 and third electrode 36 to form electrical connections with contact pads 21B, 21C and 21D, respectively. After this step, device 10 appears as in FIGS. 2c and 2d.

2) First electrode 32 is deposited from an angle $\theta_{electrode}$ and a direction φ=about 0° from axis 21C' while substrate 20 is held stationary. Angle $\theta_{electrode}$ of step (2) is greater than angle $\theta_{organic}$ of step (1) such that first electrode 32 extends past first organic layer(s) 31 and forms an electrical connection with contact pad 21B. After this step, device 10 appears as in FIGS. 2e and 2f.

3) A second organic layer(s) 33 is deposited onto substrate 20 from an angle $\theta_{organic}$ while substrate 20 is rotating about axis 20'. Angle $\theta_{organic}$ of step (3) is chosen such that second organic layer(s) 34 does not cover contact pads 21C and 21D, and leaves sufficient clearance for subsequently deposited second electrode 34 and third electrode 36 to form an electrical connection with contact pads 21C and 21D, respectively. After this step, device 10 appears as in FIGS. 2g and 2h.

4) Second electrode 34 is deposited from an angle $\theta_{electrode}$ and a direction φ=about 180° from axis 21C' while substrate 20 is held stationary. Angle $\theta_{electrode}$ of step (4) is greater than angle $\theta_{organic}$ of steps (1) and (3) such that second electrode 34 extends past first organic layer(s) 31 and second organic layer(s) 33 and forms an electrical connection with contact pad 21C. After this step, device 10 appears as in FIGS. 2i and 2j.

5) A third organic layer(s) 35 is deposited onto substrate 20 from an angle $\theta_{organic}$ while substrate 20 is rotating about axis 20'. Angle $\theta_{organic}$ of step (5) is chosen such that third organic layer(s) 36 does not cover contact pad 21D, and leaves sufficient clearance for subsequently deposited third electrode 36 to form an electrical connection with contact pad 21D. After this step, device 10 appears as in FIGS. 2k and 2l.

6) Third electrode 36 is deposited from an angle $\theta_{electrode}$ and a direction φ=about 90° from axis 21C' while substrate 20 is held stationary. Angle $\theta_{electrode}$ of step (6) is greater than angle $\theta_{organic}$ of steps (1), (3) and (5) such that third electrode 36 extends past first organic layer(s) 31, second organic layer(s) 33 and third organic layer(s) 35 and forms an electrical connection with contact pad 21D. After this step, device 10 appears as in FIGS. 2m and 2n.

7) Optionally, protective layer is deposited from an angle $\theta_{protect}$ while substrate 20 is rotating about axis 20'. Angle $\theta_{protect}$ should be greater than angles $\theta_{organic}$ and $\theta_{electrode}$ of all preceding steps such that device 10 is completely covered by protective layer 38. Protective layer 38 protects device 10 from subsequent exposure to deleterious substances. Protective layer 38 should be made of a nonconductive material because it may touch more than one of contact pads 21, first electrode 32, second electrode 34, and third electrode 36. Preferably, protective layer 38 is made of teflon deposited to a thickness of approximately 2000–5000 Å, more preferably to a thickness of about 4000–5000 Å, and most preferably to a thickness of about 5000 Å. The use of a protective layer is described in U.S. application No. Ser. 08/977,205 (filed Nov. 24, 1997) entitled "Method of Fabricating and Patterning OLEDs," by Tian, Burrows and Forrest, filed concurrently herewith, which is incorporated by reference. After this step, device 10 appears as in FIGS. 2o and 2p.

The angle "$\theta_{electrode}$" used in forgoing, process steps (2), (4) and (6) may be the same in each of the steps, or may be different. One of skill in the art is able to determine the appropriate angle $\theta_{electrode}$ for each step depending on the desired position of the particular electrode deposited in that step. Similarly, the angle "$\theta_{organic}$" used in forgoing process steps (1), (3) and (5) may be the same in each of the steps, or may be different, depending upon the desired position of the particular organic layer(s) deposited in that step. The deposition angle θ may also be varied within a step to affect the geometry of the deposited organic layer(s) or electrode.

While the present embodiment describes the fabrication of a SOLED with three independently controllable emissive organic layers, i.e., first organic layer(s) 31, second organic layer(s) 33 and third organic layer(s) 35, devices with different configurations may be fabricated. For example, by omitting steps (3) through (6), a single OLED may be fabricated. By omitting steps (5) and (6), a two color SOLED may be fabricated. By adding steps between steps (6) and (7) of the present embodiment, a four color SOLED may be fabricated, i.e., deposit an additional organic layer in accordance with step (5), and an additional electrode in accordance to step (6), but from a direction φ=about 270°, both between steps (6) and (7) of the present embodiment. The additional organic layer and electrode would result in a stack of four independently controllable OLEDs. Embodiments with different numbers of stacked OLEDs will require a different number of contact pads 21, the number of contact pads 21 required being one greater than the number of independently controllable emissive layers.

First electrode 32 and second electrode 34 should be transparent and should be thin enough to minimize the absorption of light, yet thick enough to have a low resistivity. First electrode 32 and second electrode 34 may be made of any material that is both transparent and conductive at the thickness used. Preferably, first electrode 32 and second electrode 34 are ITO/metal layers as disclosed by PCT Application WO 96/19792, which is incorporated by reference. In an embodiment where light is transmitted through third electrode 36 to a viewer, third electrode 36 is preferably made of materials and thickness preferred for first electrode 32 and second electrode 34. In an embodiment where light is transmitted through substrate 20 to a viewer, third electrode 36 is preferably made of a thick metal such as Mg/Ag, In, Ag or Au, as disclosed by PCT Application WO 96/19792, which is incorporated by reference, that reflects incident light emitted by organic layers 31, 33 and 35 back towards substrate 20 and the viewer.

First organic layer(s) 31, second organic layer(s) 33 and third organic layer(s) 35 may be made of any suitable organic light emitting material known to the art. For example, suitable organic emitting materials are described in PCT Application WO 96/19792 and U.S. Pat. No. 5,294,870, which are incorporated by reference. Typical organic light emitting materials are transparent to light in the visible spectrum, i.e. the light emitted by organic layer(s) 31, 33 and 35, so any stacking order may be used. In the embodiment where light is transmitted through substrate 20 to a viewer, light emitted by organic layer(s) 35 passes through more layers and interfaces before reaching the viewer and may be attenuated more than light emitted by organic layer(s) 33, which in turn may be attenuated more than light emitted by organic layer(s) 31, before reaching the viewer. As a result, it is preferred that the organic material with the most efficient emission be used in organic layer(s) 35, and that the organic material with the least efficient emission be used in organic layer(s) 31. Using the most common OLED materials, this means that it is preferred that first organic layer(s) 31 emit red light, second organic layer(s) 33 emit green light, and third organic layer(s) 35 emit blue light. However, other stacking orders can be used. If any of the organic light emitting materials used are not transparent to the light emitted by the other organic light emitting materials, the order of organic layer(s) 31, 33 and 35 should be such that the material that is not transparent does not block light emitted by other materials from reaching the viewer.

Each of first organic layer(s) 31, second organic layer(s) 33 and third organic layer(s) 35 may each comprise a single emission layer 31E, 33E and 35E, respectively, or may comprise the multiple layers of a double or single heterostructure configuration, as disclosed by patent application PCT WO 19792, which is incorporated by reference. Any combination of single layer, single heterostructure, or double heterostructure may be used.

Figure 3:
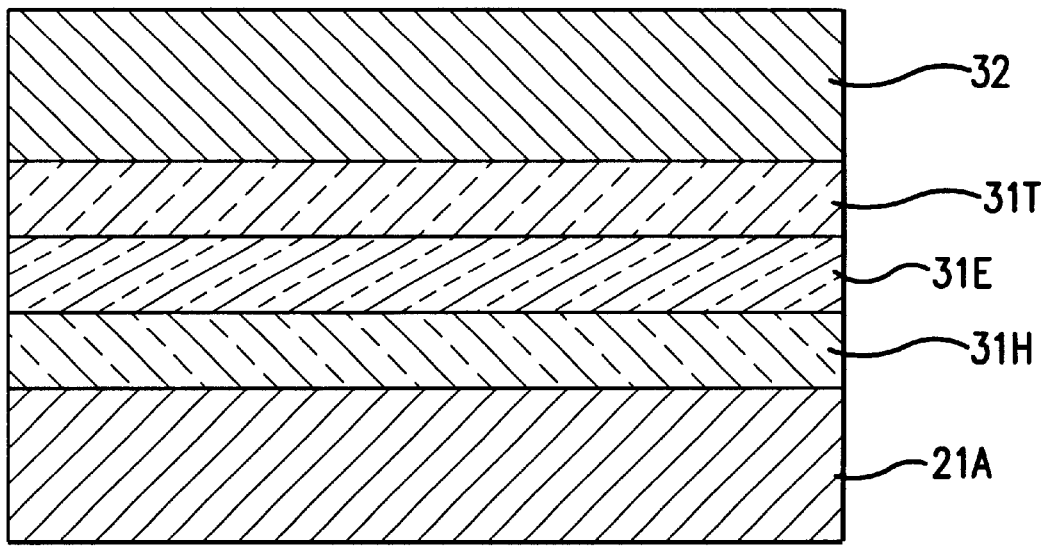
FIG. 3 shows a cross-section of a double heterostructure embodiment of the present invention.

FIG. 3 shows a double heterostructure configuration for first organic layer(s) 31. In the double heterostructure embodiment, first organic layer(s) 31 comprises three distinct layers, an emission layer ("EL") 31E sandwiched between a hole transport layer ("HTL") 31H and an electron transport layer ("ETL") 31T. A three color SOLED device 10 having a first organic layer(s) 31 that is double heterostructure may be fabricated by following the steps of the process for fabricating a three color SOLED device 10, wherein step 1 comprises the steps of sequentially depositing HTL 31H, EL 31E, and ETL 31T, all from an angle of about $\theta_{organic}$ while substrate 20 is rotating about axis 20'. HTL 31H, EL 31E, and ETL 31T are transparent because of their composition and minimal thickness. Typical thicknesses for OLED layers include the following: HTL 31H may be about 50 Å to 1000 Å thick, EL 31E may be about 50 Å to 1000 Å thick; ETL 31T may be about 50 Å to 1000 Å thick, although variations from these ranges are possible. The lower ends of the above ranges allow optimum performance and low voltage operation. Examples of suitable organic ETL, EL, and HTL materials can be found in U.S. Pat. No. 5,294,870, and PCT Application WO 96/19792, which are incorporated by reference.

Figure 4:
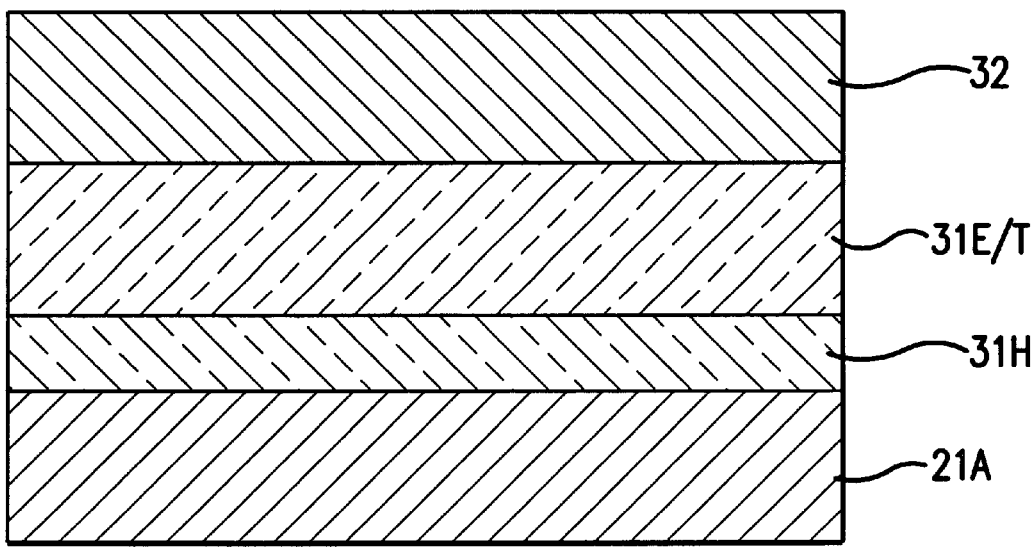
FIG. 4 shows a cross-section of a single heterostructure embodiment of the present invention.

If a single heterostructure, rather than a double heterostructure, configuration is used, EL 31E and ETL 31T of the double heterostructure configuration are replaced by a single multifunctional layer 31E/T as shown in FIG. 4. Alternatively, HTL 31H and EL 31E may be replaced by a single multifunctional layer. A three color SOLED device 10 having a first organic layer(s) 31 that is single heterostructure may be fabricated by following the steps of the process for fabricating a three color SOLED device 10, wherein step 1 comprises the steps of sequentially depositing HTL 31H and EL/ETL 31E/T, all from an angle $\theta_{organic}$ while substrate 20 is rotating about axis 20'. An example of a suitable organic multifunctional material can be found in PCT Application WO 96/19792, which is incorporated by reference. DH OLEDs often permit higher efficiencies than SH OLEDs.

In a single or double heterostructure configuration, the ordering within first organic layer(s) 31, second organic layer(s) 33, and third organic layer(s) 35 may be inverted. i.e. in a double heterostructure configuration, organic layer(s) 31 may be deposited in the order: ETL 31T, EL 31E, and HTL 31H, instead of HTL 31H, EL 31E, and ETL 31T, and in a single heterostructure configuration, organic layer(s) 31 may be deposited in the order: EL/ETL 31 E/T followed by HTL 31H. An OLED with inverted layers is referred to as an organic inverted LED, or OILED. The biasing of contact pad 21A, first electrode 32, second electrode 34 and third electrode 36 should be such that an anode contacts organic layers through which holes are transported, and a cathode contacts organic layers through which electrons are to be transported, i.e., in a double heterostructure configuration that has not been inverted, contact pad 21A should be an anode, which transports electrons away from HTL 31H, and first electrode 32 should be a cathode, which transports electrons to ETL 31T.

Figure 5A:
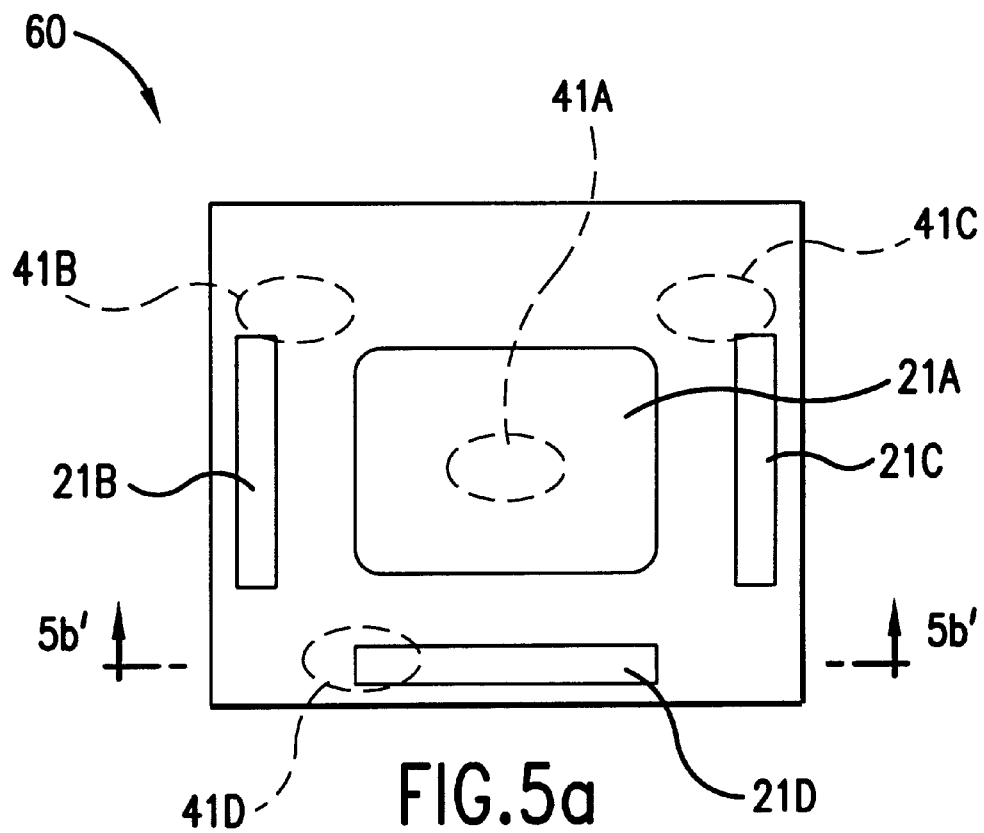
FIG. 5a shows a top view of an embodiment of the present invention having contact pads and transmission pads used to transmit power.
Figure 5B:
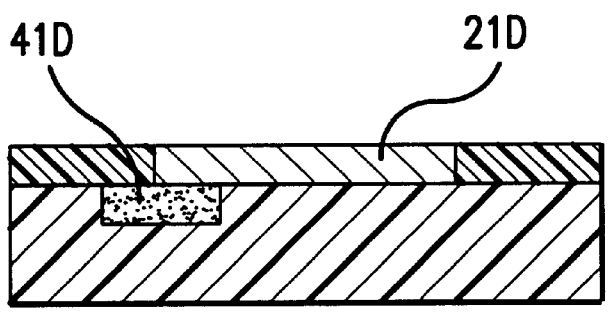

FIGS. 5a and 5b show an embodiment of the present invention in which a pixel 60, over which a device 10 will be fabricated, has contact pads 21A, 21B, 21C and 21D electrically connected to transmission pads 41, i.e., transmission pads 41A, 41B, 41C and 41D, respectively. FIG. 5b shows a cross section of FIG. 5a taken through line 5b'. The voltage at contact pads 21 is controlled by controlling the voltage at transmission pads 41, as will be discussed with reference to FIG. 6.

Figure 6:
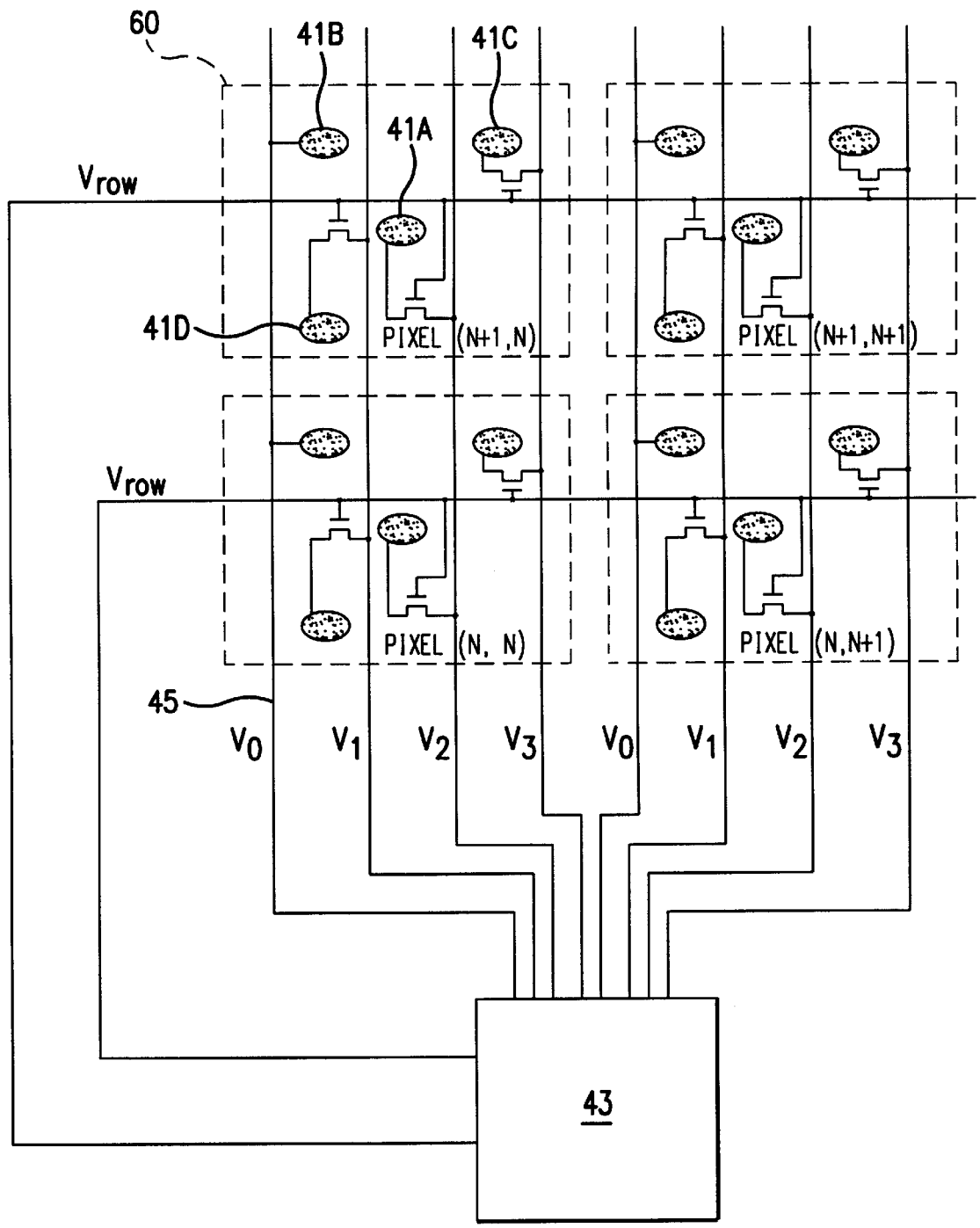
FIG. 6 shows a top view of an embodiment of the present invention having an array of pixels with the metal lines and transmission pads used to transmit power to devices fabricated on top of the pixels.

FIG. 6 shows an embodiment of the present invention having an array of pixels 60, over which an array of devices 10 (not shown) may be fabricated. Each pixel 60 has transmission pads 41A, 41B, 41C and 41D (contact pads 21A, 21B, 21C and 21D, are not shown in FIG. 6 for clarity, but are present as described with reference to FIG. 5). Transmission pads 41A, 41B, 41C and 41D are electrically connected to a multiplexing controller 43 by metal lines 45 embedded in substrate 20 (not shown in FIG. 6), such that the voltage of each transmission pad 41A, 41C and 41D underneath each device 10 may be independently controlled. Transmission pads 41B of each pixel 60 are held at a reference voltage $V_0$, i.e., ground. Transmission pads 41, multiplexing controller 43 and metal lines 45, may be fabricated using any means known in the art. In the embodiment where device 10 transmits light through substrate 20 to a viewer, transmission pads 41 and metal lines 45 are preferably small enough that they do not significantly affect the light transmitted to the viewer.

FIG. 7 shows a three color SOLED device 100 having more than one electrode held at the same reference voltage, i.e., ground, fabricated in accordance with an embodiment of the present invention. FIG. 7b is a cross section of FIG. 7a taken through line 7b'. A contact pad 121A, a first organic layer(s) 110, a first electrode 12, a second organic layer(s) 114, a second electrode 116, an insulating layer 118, a third electrode 120, a third organic layer(s) 122, and a fourth electrode 124 are stacked in that order. A protective cap (not shown) similar to protective cap 38 as shown in FIGS. 2o and 2p may be used to protect device 100. First organic layer(s) 110 is disposed between and electrically connected to contact pad 121A and first electrode 112. Second organic layer(s) 114 is disposed between and electrically connected to first electrode 112 and second electrode 116. Insulation layer 118 is disposed between and prevents electrical connection between second electrode 116 and third electrode 120. Third organic layer(s) 122 is disposed between and electrically connected to third electrode 120 and fourth electrode 124. First electrode 112 and fourth electrode 124 are electrically connected to each other and to contact pad 121B. Contact pad 121B, and hence first electrode 112 and fourth electrode 124, are held at a reference voltage, i.e., ground. Second electrode 116 is electrically connected to contact pad 121C, and third electrode 120 is electrically connected to contact pad 121D. The voltage at contact pads 121A, 121C and 121D can be independently controlled. Each of the organic layer(s) in this embodiment is therefore electrically connected between two electrodes, one of which is electrically connected to ground, and the other of which is electrically connected to a contact pad at which the voltage can be independently controlled. Light emission from first organic layer(s) 110 occurs when a voltage is applied between contact pad 121A, having an independently controllable voltage, and first electrode 112, which is electrically connected to contact pad 121B and held at ground voltage. Light emission from second organic layer(s) 114 occurs when a voltage is applied between second electrode 116, which is electrically connected to contact pad 121C having an independently controllable voltages and first electrode 112, which is electrically connected to contact pad 121B and held at ground voltage. Light emission from third organic layer(s) 122 occurs when a voltage is applied between third electrode 120, which is electrically connected to contact pad 121D having an independently controllable voltage, and fourth electrode 124, which is electrically connected to contact pad 121B and held at ground voltage. The intensity of the light emitted is determined by the magnitude of the current resulting from the applied voltage. Appropriate selection of light emitting organic materials for first organic layer(s) 110, second organic layer(s) 114 and third organic layer(s) 122, allows device 100 to emit any of various combinations of red, green and blue light by controlling the voltages on contact pads 121A, 121B, 121C and 121D.

The present invention may also be used to fabricate transparent OLEDs (TOLEDs), where the entire device is transparent to visible light. Such a device would be well suited for use in a heads up display, for example on a windshield for a car, a visor for a motorcycle or airplane helmet, or a cockpit window. TOLED devices can also be stacked to enhance intensity.

In one embodiment, the present invention may also be used to fabricate an organic device 10 designed to emit light to a viewer on the same side of substrate 20 as device 10. Substrate 20 need not be transparent in this embodiment, and a reflective layer may be deposited onto substrate 20 prior to the fabrication of device 10 in order to reflect light incident upon substrate 20 back towards the viewer. However, third electrode 36 and protective cap 38 should be transparent, and a reflective layer should not be deposited after third electrode 36. Also, it is preferable that the ordering of the colors of organic layer(s) 31, 33 and 35 should be reversed, i.e. that first organic layer(s) 31 emit red, second organic layer(s) 33 emit green, and third organic layers(s) emit blue, because in this embodiment, the last deposited layers will be closest to the viewer, not the first deposited layers.

The deposition techniques for any of the above-listed methods are well known in the art. For example, a preferred method of depositing the organic layers is by thermal evaporation; a preferred method of depositing metal layers is by thermal or electron-beam evaporation; a preferred method of depositing ITO is by electron-beam evaporation or sputtering. However, the present invention contemplates the use of any method of depositing layers of material suitable for use with a photoresist system.

The present invention can be used in a wide variety of consumer products, including computers, televisions, telecommunications devices with a display component, vehicles, billboards, signs, large area wall, theater, and stadium screens, xerography, heads up displays for windshields, cockpits and helmet visors, and video games.

The subject invention as disclosed herein may be used in conjunction with co-pending applications: "High Reliability, High Efficiency, Integratable Organic Light Emitting Devices and Methods of Producing Same", Ser. No. 08/774,119 (filed Dec. 23, 1996); "Novel Materials for Multicolor LED's", Ser. No. 08/850,264 (filed May 2, 1997); "Electron Transporting and Light Emitting Layers Based on Organic Free Radicals", Ser. No. 08/774,120 (filed Dec. 23, 1996); "Multicolor Display Devices", Ser. No. 08/772,333 (filed Dec. 23, 1996); "Red-Emitting Organic Light Emitting Devices (LED's)", Ser. No. 08/774,087 (filed Dec. 23, 1996); "Driving Circuit For Stacked Organic Light Emitting Devices", Ser. No. 08/792,050 (filed Feb. 3, 1997); "High Efficiency Organic Light Emitting Device Structures", Ser. No. 08/772,332 (filed Dec. 23, 1996); "Vacuum Deposited, Non-Polymeric Flexible Organic Light Emitting Devices", Ser. No. 08/789,319 (filed Jan. 23, 1997); "Displays Having Mesa Pixel Configuration", Ser. No. 08/794,595 (filed Feb. 3, 1997); "Stacked Organic Light Emitting Devices", Ser. No. 08/792,046 (filed Feb. 3, 1997); "High Contrast Transparent Organic Light Emitting Device Display", Ser. No. 08/821,380 (filed Mar. 20, 1997); "Organic Light Emitting Devices Containing A Metal Complex of 5-Hydroxy-Quinoxaline as A Host Material", Ser. No. 08/838,099 (filed Apr. 15, 1997); "Light Emitting Devices Having High Brightness", Ser. No. 08/844,353 (filed Apr. 18, 1997); "Organic Semiconductor Laser", Ser. No. 60/046,061 (filed May 9, 1997); "Organic Semiconductor Laser", Ser. No. 08/859,468 (filed May 19, 1997); "Saturated Full Color Stacked Organic Light Emitting Devices", Ser. No. 08/858,994 (filed May 20, 1997); "An Organic Light Emitting Device Containing a Hole Injection Enhancement Layer", Ser. No. 08/865,491 (filed May 29, 1997); "Plasma Treatment of Conductive Layers", Ser. No. PCT/US97/10252; (filed Jun. 12, 1997; Patterning of Thin Films for the Fabrication of Organic Multi-Color Displays", Ser. No. PCT/US97/10289 (filed Jun. 12, 1997); "Double Heterostructure Infrared and Vertical Cavity Surface Emitting Organic Lasers", Ser. No. 60/053,176 (filed Jul. 18, 1997); "Oleds Containing Thermally Stable Asymmetric Charge Carrier Materials", Ser. No. 08/929,029 filed (Sep. 8, 1997), "Light Emitting Device with Stack of Oleds and Phosphor Downconverter", Ser. No. 08/925,403 (filed Sep. 9, 1997), "An Improved Method for Depositing Indium Tin Oxide Layers in Organic Light Emitting Devices", Ser. No. 08/928,800 (filed Sep. 12. 1997), "Azlactone-Related Dopants in the Emissive Layer of an Oled" (filed Oct. 9, 1997), Ser. No. 08/948,130, "A Highly Transparent Organic Light Emitting Device Employing A Non-Metallic Cathode", Ser. No. 60/064,005 (filed Nov. 3, 1997), (Provisional). "A Highly Transparent Organic Light Emitting Device Employing a Non-Metallic Cathode", (filed Nov. 5, 1997); and "Low Pressure Vapor Phase Deposition of Organic Thin films", Ser. No. 08/972,156 (filed Nov. 17, 1997); each co-pending application being incorporated herein by reference in its entirety. The subject invention may also be used in conjunction with the subject matter of each of co-pending U.S. patent application Ser. Nos. 08/354,674, 08/613,207, 08/632,322 and 08/693,359 and provisional patent application Ser. Nos. 60/010,013, 60/024,001 and 60/025,501, each of which is also incorporated herein by reference in its entirety.

What is claimed is:

1. An organic light emitting device comprising:
   a. a substrate having at least first, second and third contact pads;
   b. a first organic layer deposited on said substrate and contacting said first contact pad;
   c. a first electrode deposited on said first organic layer and contacting said second contact pad;
   d. a second organic layer deposited on said first electrode, wherein said second organic layer does not completely cover said first electrode;
   e. a second electrode deposited on said second organic layer and contacting said third contact pad;
   wherein light emission from said first organic layer occurs when a voltage is applied between said first and second contact pads and light emission from said second organic layer occurs when a voltage is applied between said second and third contact pads.

2. The organic light emitting device of claim 1 further comprising:
   a. said substrate having a fourth contact pad;
   b. a third organic layer deposited on second electrode;
   c. a third electrode deposited on said third organic layer and contacting said fourth contact pad;
   wherein light emission from said third organic layer occurs when a voltage is applied between said third and fourth contact pads.

3. The organic light emitting device of claim 2 wherein said third organic layer does not completely cover said second electrode.

4. The organic light emitting device of claim 2 wherein said third electrode does not completely cover said third organic layer.

5. The organic light emitting device of claim 1 wherein said first organic layer completely covers said first contact pad.

6. The organic light emitting device of claim 1 wherein said first electrode does not completely cover said first organic layer.

7. The organic light emitting device of claim 1 wherein said second electrode does not completely cover said second organic layer.

* * * * *